(12) United States Patent
Lin

(10) Patent No.: US 9,571,073 B2
(45) Date of Patent: Feb. 14, 2017

(54) 3D CLOCK DISTRIBUTION CIRCUITS AND METHODS

(71) Applicant: TAIWAN SEMICONDUCTOR MANUFACTURING CO., LTD., Hsin-Chu (TW)

(72) Inventor: Mu-Shan Lin, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 6 days.

(21) Appl. No.: 14/636,224

(22) Filed: Mar. 3, 2015

(65) Prior Publication Data

US 2015/0180456 A1     Jun. 25, 2015

Related U.S. Application Data

(63) Continuation of application No. 14/024,660, filed on Sep. 12, 2013, now Pat. No. 9,000,823.

(51) Int. Cl.
*H03K 3/00*    (2006.01)
*H01L 25/00*   (2006.01)
*H03K 5/01*    (2006.01)
*H03K 5/06*    (2006.01)
*H03L 7/00*    (2006.01)
*H03K 5/00*    (2006.01)

(52) U.S. Cl.
CPC ........... *H03K 5/01* (2013.01); *H03K 5/06* (2013.01); *H03L 7/00* (2013.01); *H03K 2005/00156* (2013.01)

(58) Field of Classification Search
CPC ............... G06F 1/10; G06F 1/04; G06F 1/08; G06F 1/06; H01L 27/0207; H01L 2924/3011
USPC ................... 327/291–297, 170–177
See application file for complete search history.

(56) References Cited

U.S. PATENT DOCUMENTS

| | | | |
|---|---|---|---|
| 6,255,884 B1 | 7/2001 | Lewyn | |
| 7,237,217 B2 | 6/2007 | Restle | |
| 7,863,960 B2 | 1/2011 | Wang et al. | |
| 8,466,739 B2 | 6/2013 | Kim et al. | |
| 2007/0033560 A1* | 2/2007 | Johnston | G06F 17/505 716/114 |
| 2010/0277210 A1* | 11/2010 | Wang | H03L 7/099 327/147 |

OTHER PUBLICATIONS

Tiwari, N., et al, "Skew generation and analysis in timing-critical circuits", EDN, pp. 87-96, Nov. 13, 2003.*

* cited by examiner

*Primary Examiner* — Lincoln Donovan
*Assistant Examiner* — Thomas Skibinski
(74) *Attorney, Agent, or Firm* — Duane Morris LLP

(57) ABSTRACT

An integrated circuit includes a clock source tier and at least two clock distribution tiers disposed in a vertical stack with the clock source tier. The clock source tier includes a clock circuit. Each of the at least two clock distribution tiers includes a clock distribution circuit. Each clock distribution circuit includes at least one pair of cross-coupled inverters.

16 Claims, 13 Drawing Sheets

3D CLOCK DISTRIBUTION CIRCUITS AND METHODS

CROSS-REFERENCE TO RELATED APPLICATIONS

This application is a continuation of U.S. patent application Ser. No. 14/024,660, filed Sep. 12, 2013, now U.S. Pat. No. 9,000,823, the entirety of which is incorporated by reference herein.

BACKGROUND

The disclosed circuits and methods relate to integrated circuits. More particularly, the disclosed circuits and methods relate to clock distribution networks in three-dimensional integrated circuits.

Microprocessors and other integrated circuits include clock distribution networks for routing a clock signal to the circuitry of the microprocessor or other integrated circuits. These clock network are typically formed in a two-dimensional layout and have stringent timing and power requirements. Skew and jitter of the clock network cause clock uncertainty and decrease the timing margins.

DETAILED DESCRIPTION

This description of the exemplary embodiments is intended to be read in connection with the accompanying drawings, which are to be considered part of the entire written description.

Figure 1A:
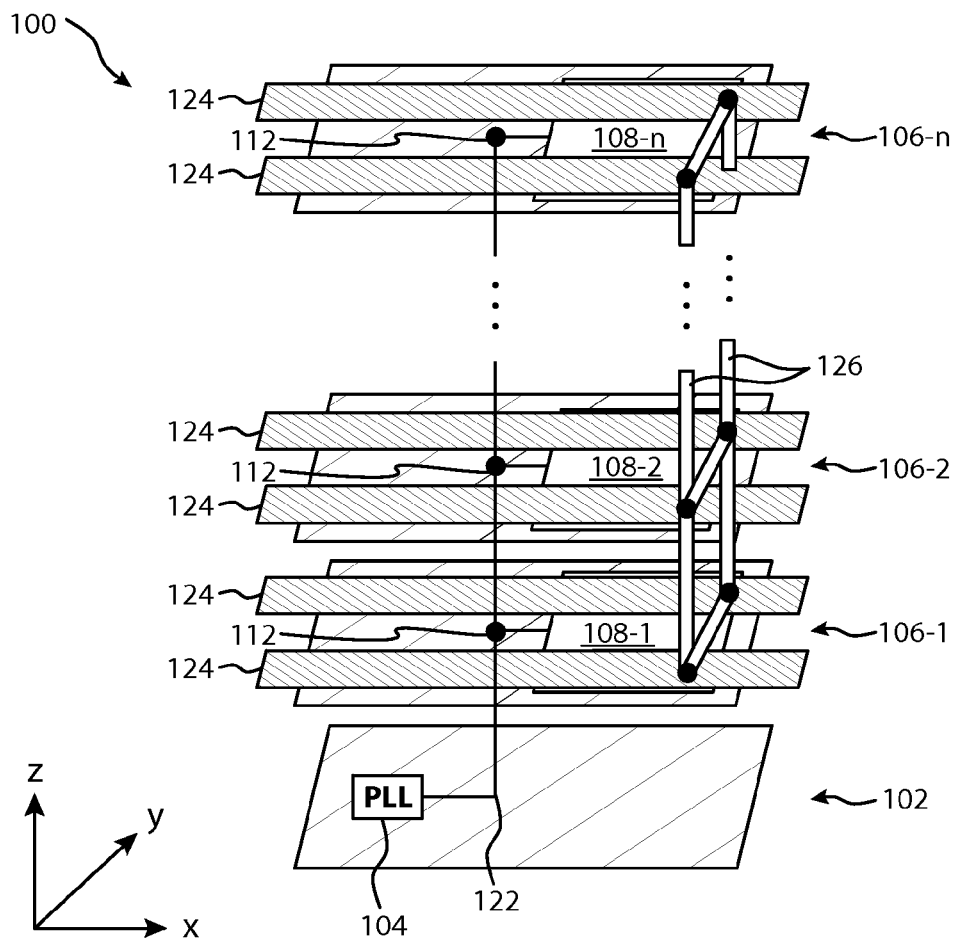
FIG. 1A illustrates one example of a three-dimensional clock distribution network in accordance with some embodiments.

FIG. 1A illustrates one example of a three-dimensional ("3D") clock distribution ("CD") network 100 in accordance with some embodiments. 3D CD network 100 includes a first tier 102, on which a clock circuit 104, such as a phase-locked loop ("PLL") circuit, is disposed. In some embodiments, tier 102 is referred to as a "clock source tier" or as a "clock generation tier." A number, n, of tiers 106 are vertically stacked on top of one another in the z-direction with each tier 106-1, 106-2, . . . , 106-$n$ including a respective clock tree circuit 108-1, 108-2, . . . , 108-$n$ (collectively "clock tree circuits 108") disposed thereon where n is an integer greater than or equal to 2. Tiers 106 are sometimes referred to herein as "clock tree tiers 106" and in some embodiments are symmetrical to one another.

Figure 1B:
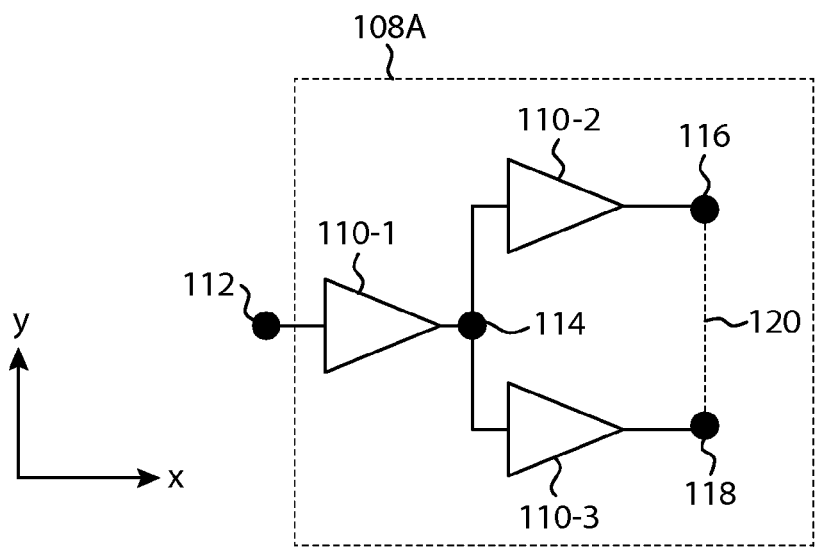
FIG. 1B is a circuit diagram of one example of a clock tree circuit in accordance with some embodiments.

As best seen in FIG. 1B, in some embodiments, each clock tree circuit 108A includes a plurality of clock processing circuits 110-1, 110-2, 110-3 disposed in a tree arrangement. For example, clock processing circuit 110-1 has an input coupled to node 112 and an output coupled to node 114 to which the respective inputs of clock processing circuits 110-2, 110-3 are coupled. In some embodiments, clock processing circuits are implemented as buffer circuits or as an inverter. The output of clock processing circuit 110-2 is coupled to clock destination node 116, and the output of clock processing circuit 110-3 is coupled to clock destination node 118. In some embodiments, clock destination nodes 116 and 118 are coupled together by an optional conductive trace 120 to ensure that clock signals propagating through clock processing circuits 110-2, 110-3 are received at nodes 116, 118, respectively, at the same time.

Figure 1C:
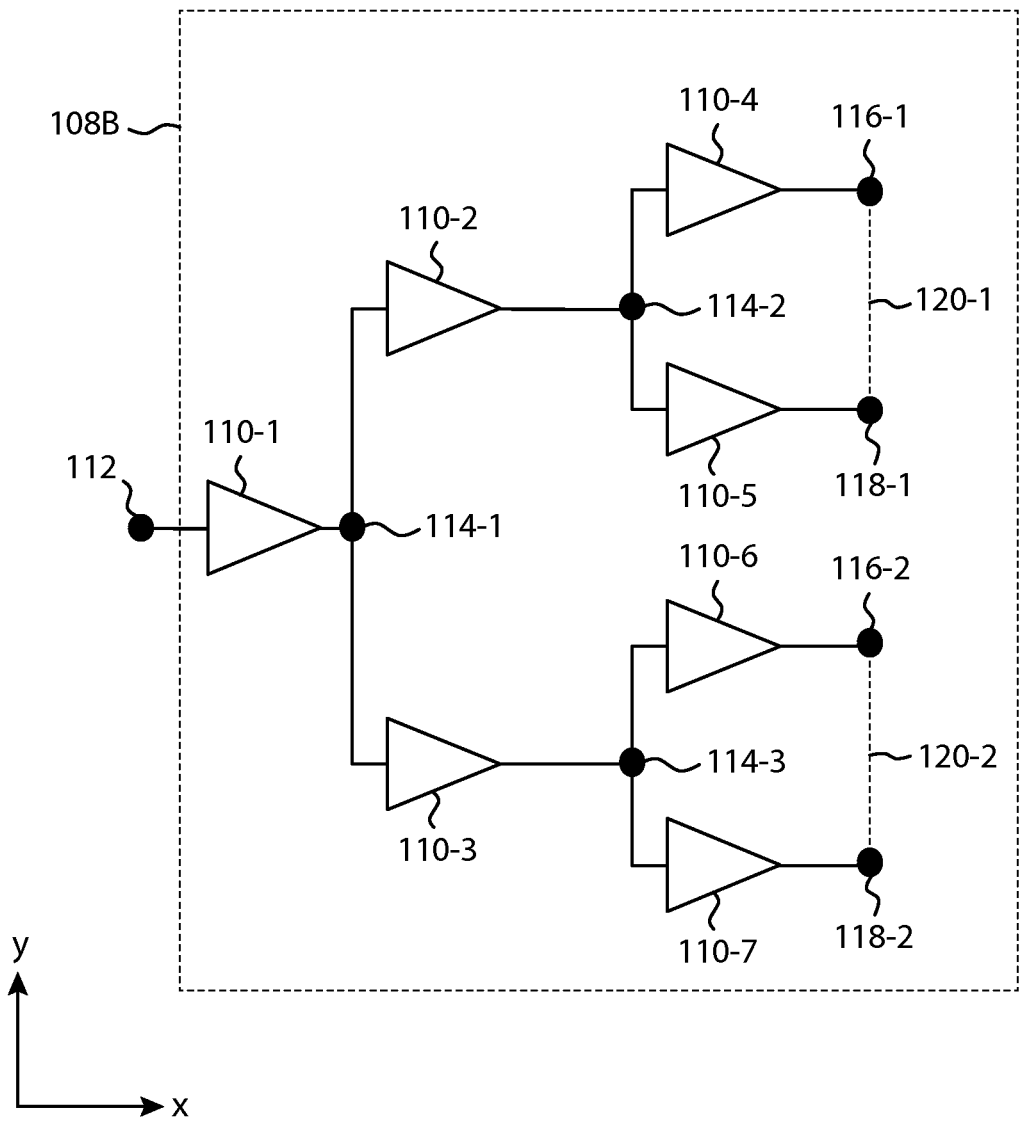
FIG. 1C is a circuit diagram of another example of a clock tree circuit in accordance with some embodiments.

FIG. 1C illustrates another example of a clock tree circuit in accordance with some embodiments. Clock tree circuit 108B includes an input node 112 coupled to the input of clock processing circuit 110-1. The output of clock processing circuit 110-1 is coupled to node 114-1 to which respective inputs of clock processing circuits 110-2, 110-3 are coupled.

The output of clock processing circuit 110-2 is coupled to node 114-2 to which the respective inputs of clock processing circuits 110-4 and 110-5 are coupled. Clock processing circuit 114-4 includes an output coupled to node 116-1, and clock processing circuit 114-5 includes an output coupled to node 118-1.

Clock processing circuit 110-3 includes an output coupled to intermediate node 114-3, which is coupled to an input of clock processing circuit 110-6 and to an input of clock processing circuit 110-7. An output of clock processing circuit 110-6 is coupled to node 116-2, and an output of clock processing circuit 110-7 is coupled to node 118-2. In some embodiments, clock destination nodes 116-1 and 118-1 and clock destination nodes 116-2 and 118-2 are coupled together by an optional conductive trace 120-1 and 120-2, respectively, to ensure that the clock signals are received at clock destination nodes 116, 118 at the same time. In some embodiments, clock destination nodes 116-1, 116-2, 118-1, and 118-2 are all coupled together by one or more conductive traces. One of ordinary skill in the art will understand that clock-tree circuits 108 can have other configurations and implementations including fewer or more clock processing circuits, which can also include logic gates such as AND, NAND, OR, and NOR gates to list only a few possibilities.

Referring again to FIG. 1A, the clock tree circuits 108 are coupled together by one or more conductive lines 122, that is also coupled to clock circuit 104 disposed in the clock tier 102. In some embodiments, conductive line 122 includes metal lines, vias, TSVs (through-substrate vias), and/or inter-layer vias ("ILVs") formed by a 3D stacked CMOS process used to create a 3D integrated circuit ("IC"). Conductive line 122 is coupled to the input nodes 112 of the clock-tree circuits 108. Each clock tree tier 106 includes power grid lines 124 formed in a conductive layer (e.g., M1, M2, M3, etc.) formed over the clock tree circuit 108. In some embodiments, nodes 116 and/or nodes 118 of clock tree circuits 108 are coupled together by one or more conductive lines 126, which can include metal lines, vias, TSVs, and ILVs. Tying together nodes 116 and 118 using conductive traces 120 and conductive lines 126 removes tier-to-tier on-chip variations and global/local variations.

The vertical stack of clock tree tiers advantageously reduces the floor plan of the clock distribution network. For example, a vertically stacked clock tier network where the number, n, of clock tree tiers 106 is equal to four can be implemented with a floor plan that is ¼ the size of a floor plan implemented in two dimensions. Additionally, the use of ILVs to distribute clock signals from a clock source tier 102 to a vertical stack of clock tree tiers 106 reduces the parasitic load on the clock distribution network, which results in higher operating speeds, due to the relatively shorter lengths of ILVs compared to the length of traces in a two-dimensional layouts and when the conductive lines are implemented using TSVs as TSVs are longer than ILVs.

Figure 2:
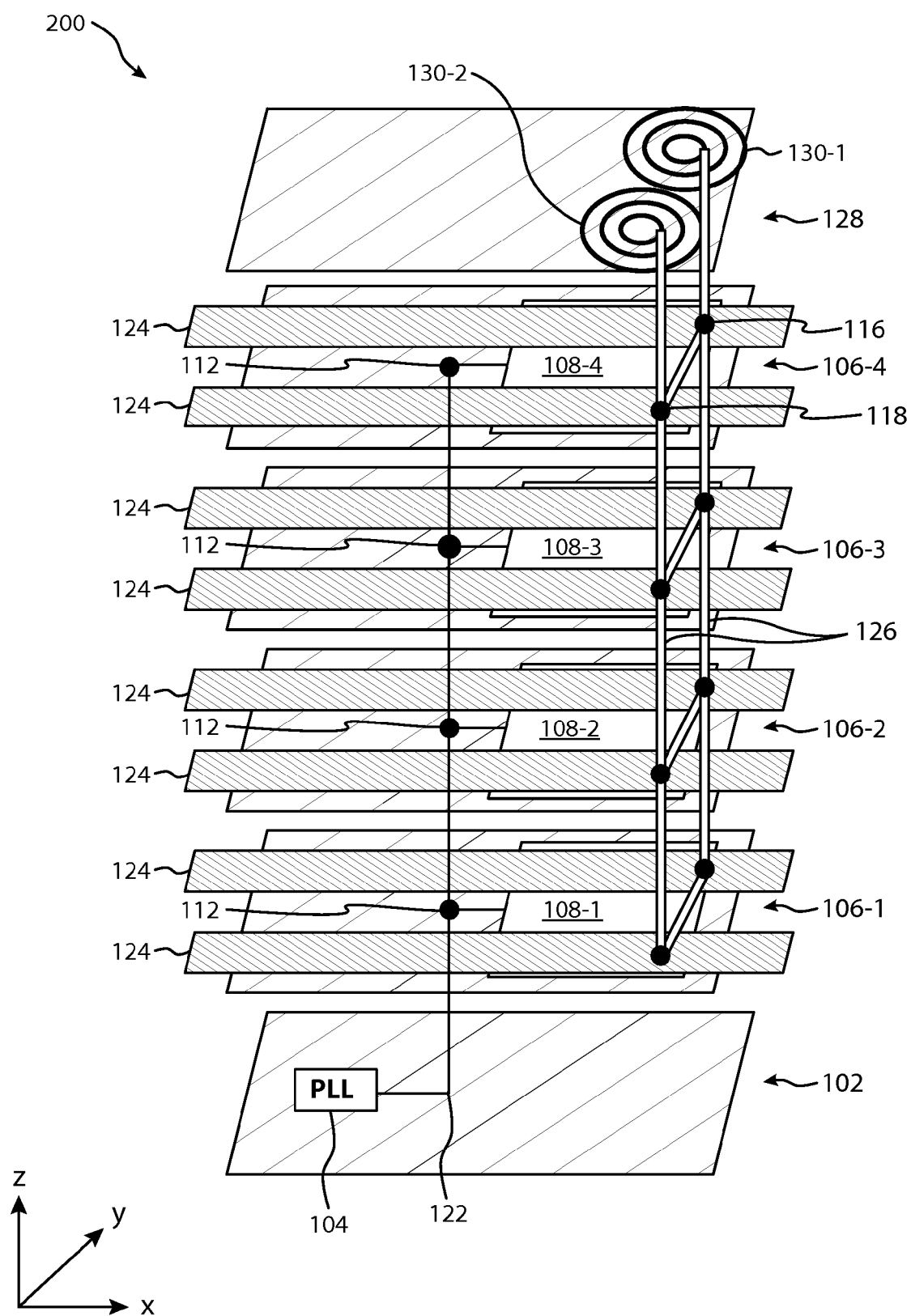
FIG. 2 illustrates another example of a three-dimensional clock distribution network in accordance with some embodiments.

In some embodiments, an inductive tier is provided to further reduce parasitic capacitances at the clock destination nodes. For example, FIG. 2 illustrates one example of a vertical CD network 200 configured with an inductive tier 128. As shown in FIG. 2, clock distribution network 200 includes a clock source tier 102 over which four clock tree tiers 106-1, 106-2, 106-3, 106-4 are disposed. Clock source tier 102 includes a clock generation circuit 104, and each clock tree tier 106 includes one or more clock tree circuits 108 including two or more destination nodes 116, 118 (FIGS. 1B, 1C).

An inductive tier 128 is disposed over clock tree tier 106-4 and includes a pair of inductors 130-1, 130-2 (collectively "inductors 130"). Inductors 130 are arranged in tier 128 such that they are disposed over clock destination nodes 116, 118 of the clock tree tiers 106. For example, inductor 130-1 is disposed vertically (i.e., in the z-direction) above destination node 116, and inductor 130-2 is disposed vertically above destination node 118. In some embodiments, inductors 130-1, 130-2 are coupled to destination nodes 116, 118, respectively, by conductive lines 126.

The arrangement of the tiers, e.g., clock source tiers, clock tree tiers, and inductive tiers, can be varied. The number and types of circuits on each of the tiers also can be varied. For example, FIG. 3 illustrates one example of a 3D CD network 300 in which each clock tree tier 106 includes a pair of clock tree circuits 108 and the clock source tier 132 is disposed between clock tree tiers 106 and includes a clock tree circuit 108.

Figure 3:
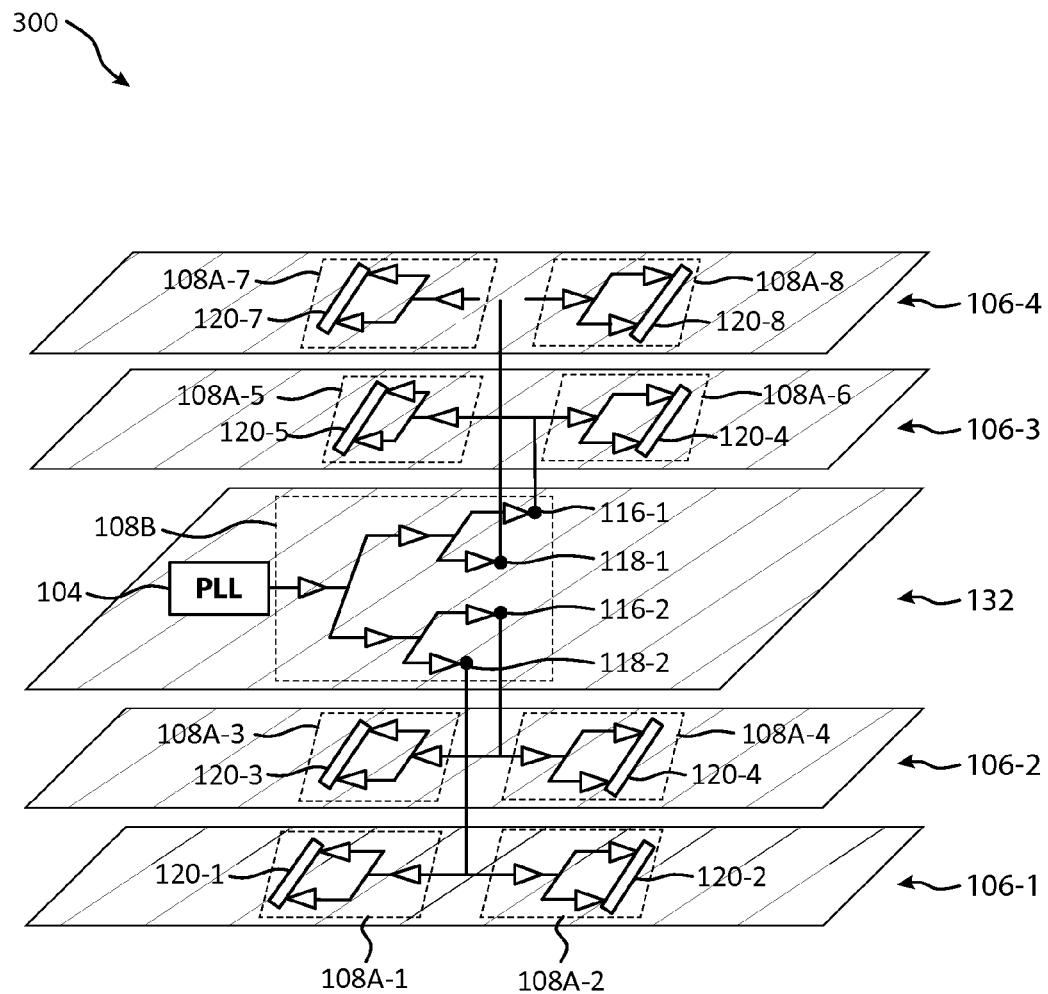
FIG. 3 illustrates another example of a three-dimensional clock distribution network in accordance with some embodiments.
Figure 3:
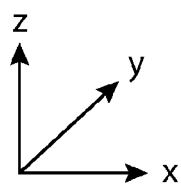

As shown in FIG. 3, clock source tier 132 includes a clock circuit 104 that is coupled to a clock tree circuit 108B, which has a configuration as illustrated in FIG. 1C. Clock tree tiers 106-1 and 106-2 are disposed vertically (i.e., in the z-direction) below clock source tier 132, and clock tree tiers 106-3 and 106-4 are disposed vertically (i.e., in the z-direction) above clock source tier 132. Each of the four destination nodes 116-1, 116-2, 118-1, 118-2 of the clock tree circuit 108B is coupled to a respective clock tree tier 106.

For example, node 118-2 of clock tree circuit 108B is coupled to clock tree circuits 108A-1 and 108A-2 of clock tree tier 106-1 by a conductive line 122. In some embodiments, clock tree circuits 108A-1 and 108A-2 have the configuration of clock tree circuit 108A illustrated in FIG. 1B and the destination nodes of clock tree circuits 108A-1 and 108A-2 are coupled together by conductive traces 120-1, 120-2, respectively.

Node 116-2 of clock tree circuit 108B is coupled to clock tree tier 106-2 by a conductive line 122 extending from clock source tier 132 to clock tree tier 106-2. Clock tree tier 106-2 includes clock tree circuits 108A-3 and 108A-4. The destination nodes of clock tree circuit 108A-3 are coupled together by a conductive trace 120-3, and the destination nodes of clock tree circuit 108A-4 are coupled together by a conductive trace 120-4.

Node 118-1 of clock tree circuit 108B is coupled to clock tree tier 106-3 by a conductive line 122 extending from clock source tier 132 to clock tree tier 106-3, which is disposed vertically above clock source tier 132. Clock tree tier 106-3 includes clock tree circuits 108A-5 and 108A-6. The destination nodes of clock tree circuit 108A-5 are coupled together by a conductive trace 120-5, and the destination nodes of clock tree circuit 108A-6 are coupled together by a conductive trace 120-6.

Node 116-1 of clock tree circuit 108B is coupled to clock tree tier 106-4 by a conductive line 122 extending from clock source tier 132 to clock tree tier 106-4, which is disposed vertically above clock source tier 132. Clock tree tier 106-4 includes clock tree circuits 108A-7 and 108A-8. The destination nodes of clock tree circuit 108A-7 are coupled together by a conductive trace 120-7, and the destination nodes of clock tree circuit 108A-8 are coupled together by a conductive trace 120-8.

Clock tree tier 132 generates and distributes a clock signal to each of the clock tree tiers 106, which each include a two-dimensional clock grid (i.e., multiple clock tree circuits 108). Optional conductive traces 120 are configured to prevent clock skew within each tier, but can be eliminated depending on the constraints of the circuit to which the clock tree circuits are to provide the clock signals. Although not shown in FIG. 3, the 3D clock distribution network 300 could include an inductive tier 128 configured with inductors 130 that are aligned vertically with the destination nodes of the clock tree circuits 108A.

Figure 4:
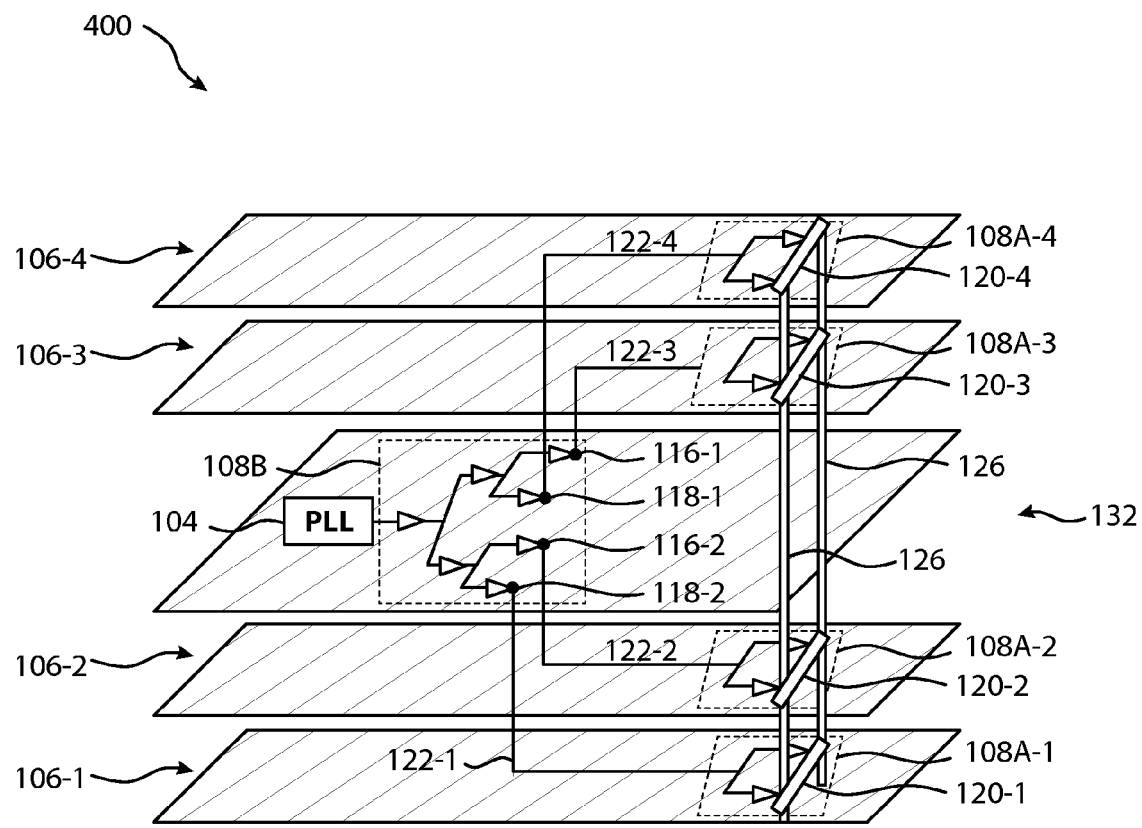
FIG. 4 illustrates another example of a three-dimensional clock distribution network in accordance with some embodiments.
Figure 4:
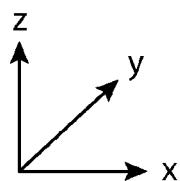

The 3D CD networks can be configured in a variety of ways to ensure the clock signal generated at the clock source tier is received at multiple points simultaneously and without skew. For example, FIG. 4 illustrates another example of a 3D CD network 400 configured with a clock source tier 132 disposed between clock tree tiers 106-2 and 106-3, which are disposed below and above clock source tier 132, respectively. Clock tree tier 106-1 is disposed below clock tree tier 106-2 and includes a clock tree circuit 108A-1, which is coupled by a conductive line 122-1 to node 118-2 of clock source tier 132. The clock destination nodes of clock tree tier 106-1 are coupled together by a conductive line 120-1.

Clock tree tier 106-2, which is positioned vertically between clock source tier 132 and clock tree tier 106-1, includes a clock tree circuit 108A-2 that is coupled to clock tree circuit 108B of clock source tier 132. In particular, clock tree circuit 108A-2 is coupled to node 116-2 of clock tree circuit 108B by a conductive line 122-2. The destination nodes of clock tree circuit 108A-2 are coupled together by one or more conductive traces 120-2, which are formed in a conductive layer (e.g., M1, M2, M3, etc.) formed over an active region in which the active devices of clock tree circuit 108A-2 are formed.

Clock tree tier 106-3 is disposed vertically beneath clock tree tier 106-4 and vertically above clock source tier 132 and includes a clock tree circuit 108A-3. Clock tree circuit 108A-3 is coupled to clock destination node 116-1 of clock tree circuit 108B by conductive line 122-3, which extends from clock source tier 132 to clock tree tier 106-3. The destination nodes of clock tree circuit 108A-3 are coupled together by one or more conductive trances 120-3, which are formed in a conductive layer disposed over an active region in which the active devices of clock tree circuit 108A-3 are formed.

The upper-most tier of 3D CD network 400 is clock tree tier 106-4, which includes a clock tree circuit 108A-4. Clock tree circuit 108A-4 is coupled to destination node 118-1 of clock tree circuit 108B by a conductive line 122-4. In some embodiments, conductive line 122-4 is an ILV of a 3D IC that extends between clock tree tier 106-4 and clock tier 132. The destination nodes of clock tree circuit 108A-4 are coupled together by a conductive trace 120-4. Conductive traces 126 extend vertically through 3D clock distribution network 400 and couple together destination nodes of clock tree circuits 108A-1, 108A-2, 108A-3, and 108A-4 disposed in clock tree tiers 106-1, 106-2, 106-3, and 106-4, respectively, to ensure the clock signal arrives at the destination nodes in different tiers simultaneously.

Figure 5:
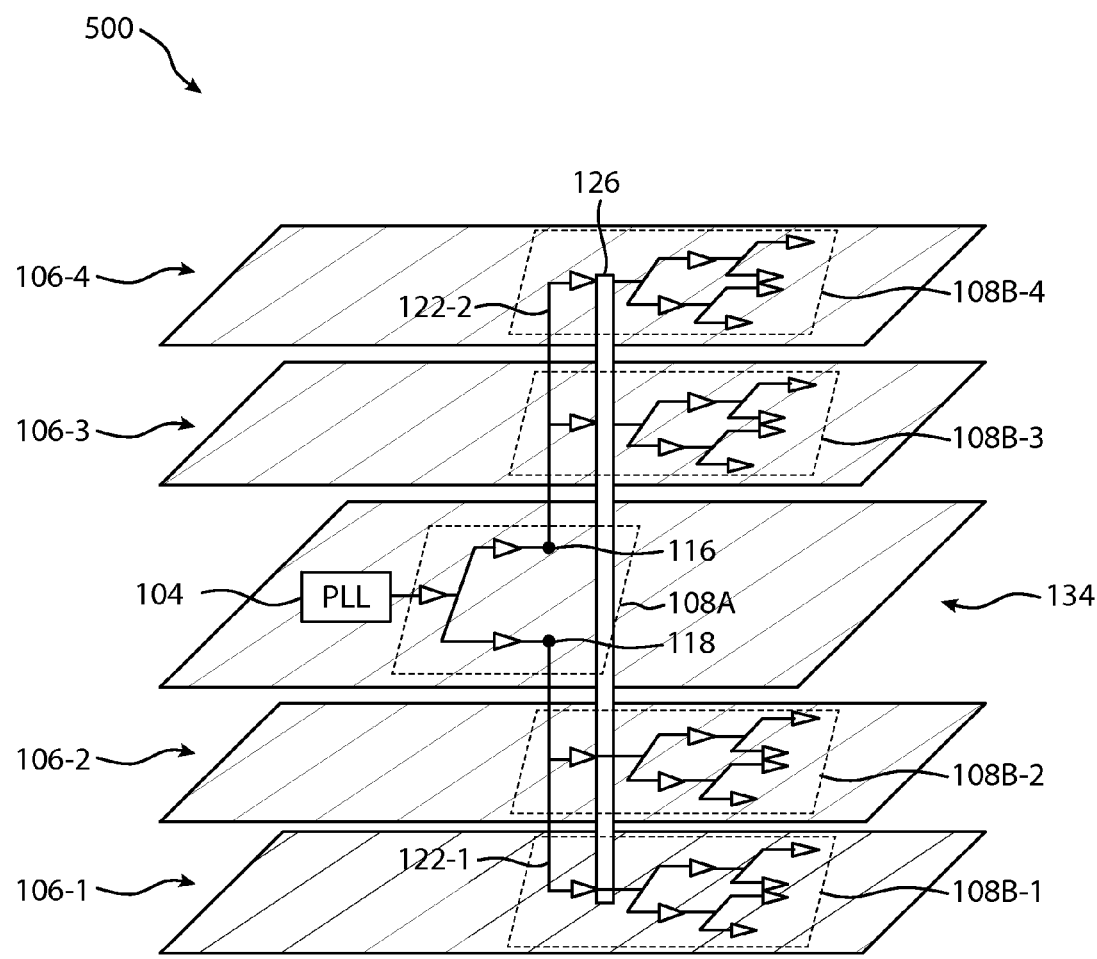
FIG. 5 illustrates another example of a three-dimensional clock distribution network in accordance with some embodiments.

FIG. 5 illustrates another example of a 3D CD network 500 implemented as a 3D IC and arranged such that the clock signal generated by a clock source tier is received at the clock tree tiers approximately simultaneously. 3D CD network 500 includes a clock source tier 134 disposed between clock tree tiers 106-2 and 106-3. Clock tree tier 106-2 is disposed vertically above clock tree tier 106-1 and vertically below clock source tier 134, and clock tree tier 106-3 is disposed vertically above clock source tier 106-3 and vertically below clock tree tier 106-4.

Clock source tier 134 includes a clock tree circuit 108A, which is coupled to clock tree circuits 108B-1 and 108B-2 by conductive line 122-1 and to clock tree circuits 108B-3 and 108B-4 by conductive line 122-2. In some embodiments, clock tree circuits 108B (i.e., clock tree circuits 108B-1, 108B-2, 108B-3, and 108B-4) have a configuration in accordance with the configuration illustrated in FIG. 1C, and clock tree circuit 108A has a configuration in accordance with the configuration illustrated in FIG. 1B.

A conductive line 126 extends from clock tree tier 108B-1 to clock tree tier 108B-4 and ensures the distribution of the clock signal from clock source tier 134 is distributed simultaneously as of the output of the first clock processing circuit 110-1 (FIG. 1C) to prevent tier-to-tier clock skew. As described above, in some embodiments, conductive lines 122-1, 122-2, and 126 are implemented as ILVs.

Figure 6:
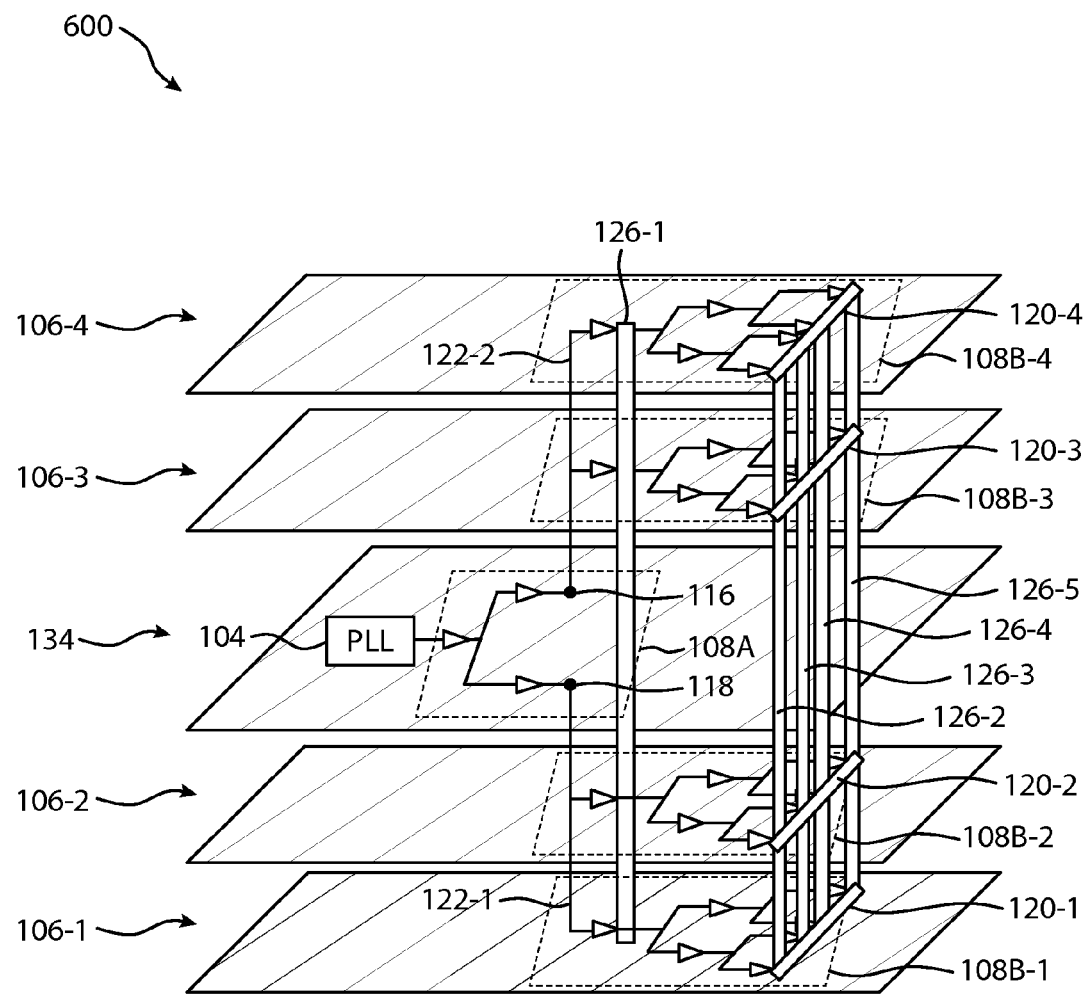
FIG. 6 illustrates another example of a three-dimensional clock distribution network in accordance with some embodiments.

FIG. 6 illustrates a configuration of a more aggressive approach for preventing tier-to-tier and intra-tier clock skew. 3D CD network 600 of FIG. 6 includes a clock source tier 134 disposed between clock tree tiers 106-2 and 106-3. Clock tree tier 106-2 is disposed vertically above clock tree tier 106-1 and vertically below clock source tier 134, and clock tree tier 106-3 is disposed vertically above clock source tier 106-3 and vertically below clock tree tier 106-4.

Clock source tier 134 includes a clock tree circuit 108A, which is coupled to clock tree circuits 108B-1 and 108B-2 by conductive line 122-1 and to clock tree circuits 108B-3 and 108B-4 by conductive line 122-2. In some embodiments, clock tree circuits 108B (i.e., clock tree circuits 108B-1, 108B-2, 108B-3, and 108B-4) have a configuration in accordance with the configuration illustrated in FIG. 1C, and clock tree circuit 108A has a configuration in accordance with the configuration illustrated in FIG. 1B.

A conductive line 126-1 extends from clock tree tier 106B-1 to clock tree tier 106B-4 and ensures the distribution of the clock signal from clock source tier 134 is distributed simultaneously as of the output of the first clock processing circuit 110-1 (FIG. 1C) to prevent tier-to-tier clock skew. Conductive lines 126-2, 126-3, 126-4, and 126-5 are coupled to the destination nodes of the clock tree circuits 108B-1, 108B-2, 108B-3, are 108B-4 (collectively "clock tree circuits 108B") in each of the clock tree tiers 106-1, 106-2, 106-3, and 106-4. For example, in some embodiments, conductive line 126-2 (FIG. 6) is coupled to node 118-2 (FIG. 1C) of clock tree circuits 108B, conductive line 126-3 (FIG. 6) is coupled to node 116-2 (FIG. 1C) of clock tree circuits 108B, conductive line 126-4 (FIG. 6) is coupled to node 118-1 (FIG. 1C) of clock tree circuits 108B, and conductive line 126-5 is coupled to node 116-1 (FIG. 1C) of clock tree circuits 108B. As described above, in some embodiments, conductive lines 122-1, 122-2, 126-1, 126-2, 126-3, 126-4, and 126-5 are implemented as ILVs.

The destination nodes in each tier are also coupled together by a conductive trace to prevent intra-tier skew. For example, the destination nodes of clock tree circuit 108B-1 in clock tree tier 106-1 are coupled together by conductive trace 120-1, and the destination nodes of clock tree circuit 108B-2 in clock tree tier 106-2 are coupled together by conductive trace 120-2. The destination nodes of clock tree circuit 108B-3 in clock tree tier 106-3 are coupled together by conductive trace 120-3, and the destination nodes of clock tree circuit 108B-4 in clock tree tier 106-4 are coupled together by conductive trace 120-4. In some embodiments conductive traces 120-1, 120-2, 120-3, and 120-4 are disposed in a conductive layer (e.g., M1, M2, M3, etc.) formed above an active layer in which the active devices of the clock tree circuits 108B are formed.

Figure 7A:
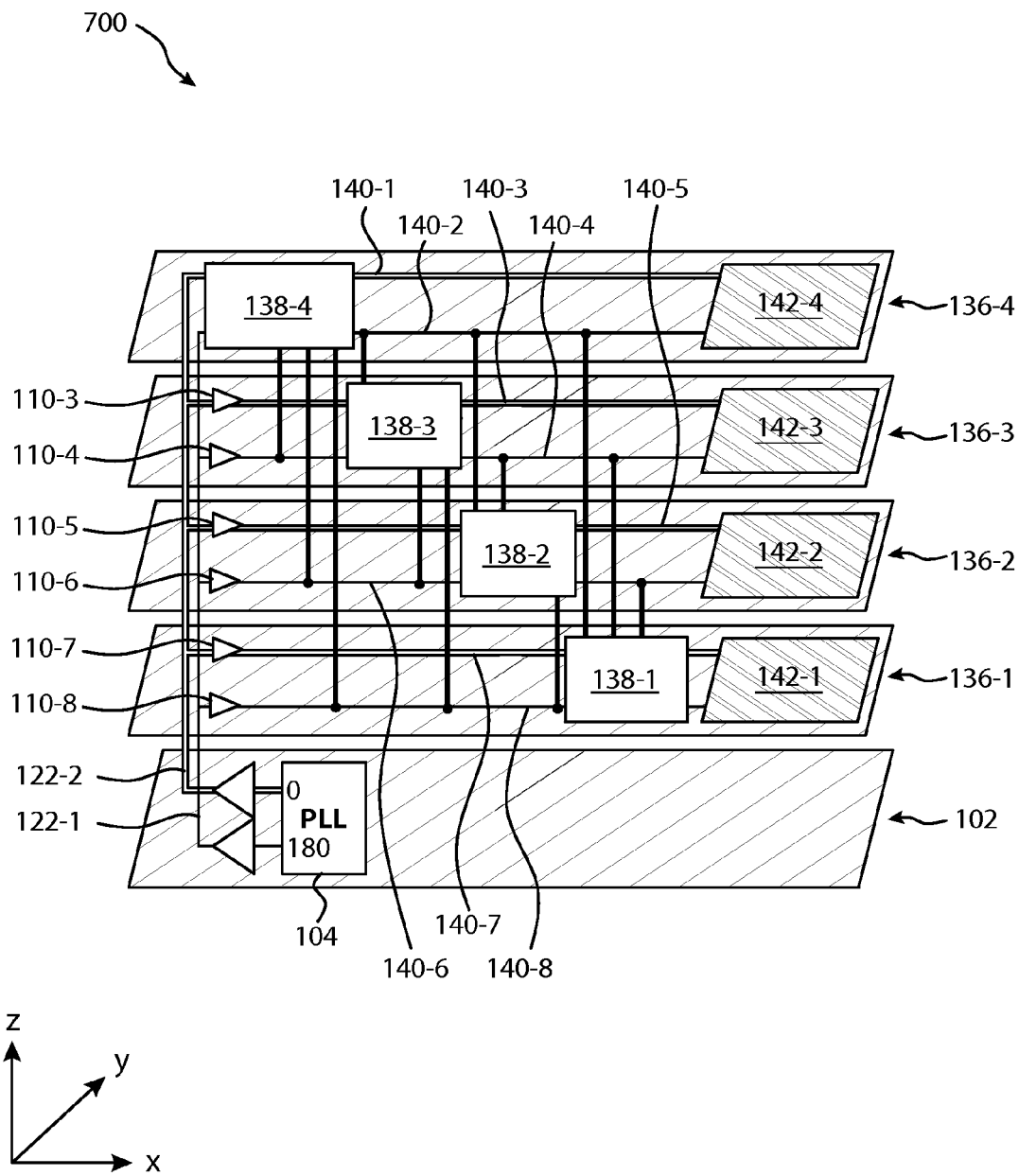
FIG. 7A illustrates an example of a three-dimensional clock distribution network including a differential clock circuit in accordance with some embodiments.

FIG. 7A illustrates one example of a 3D CD network 700 in which multiple lanes are served by a single differential clock source located in a clock source tier. For example, clock source tier 102 includes a differential clock circuit 104 including a pair of output ports that each output a respective clock signal, which are 180° out of phase with one another. Both phases are distributed to clock distribution tiers 136-1, 136-2, 136-3, 136-4 (collectively "clock distribution tiers 136"), which are disposed over clock source tier 102 by conductive lines 122-1, 122-2, respectively. Although clock distribution tiers 136 are illustrated as being disposed over clock source 102, other configurations are possible such that clock source tier 102 can be disposed above clock distribution tiers 136 or between at least two clock distribution tiers 136.

Figure 7B:
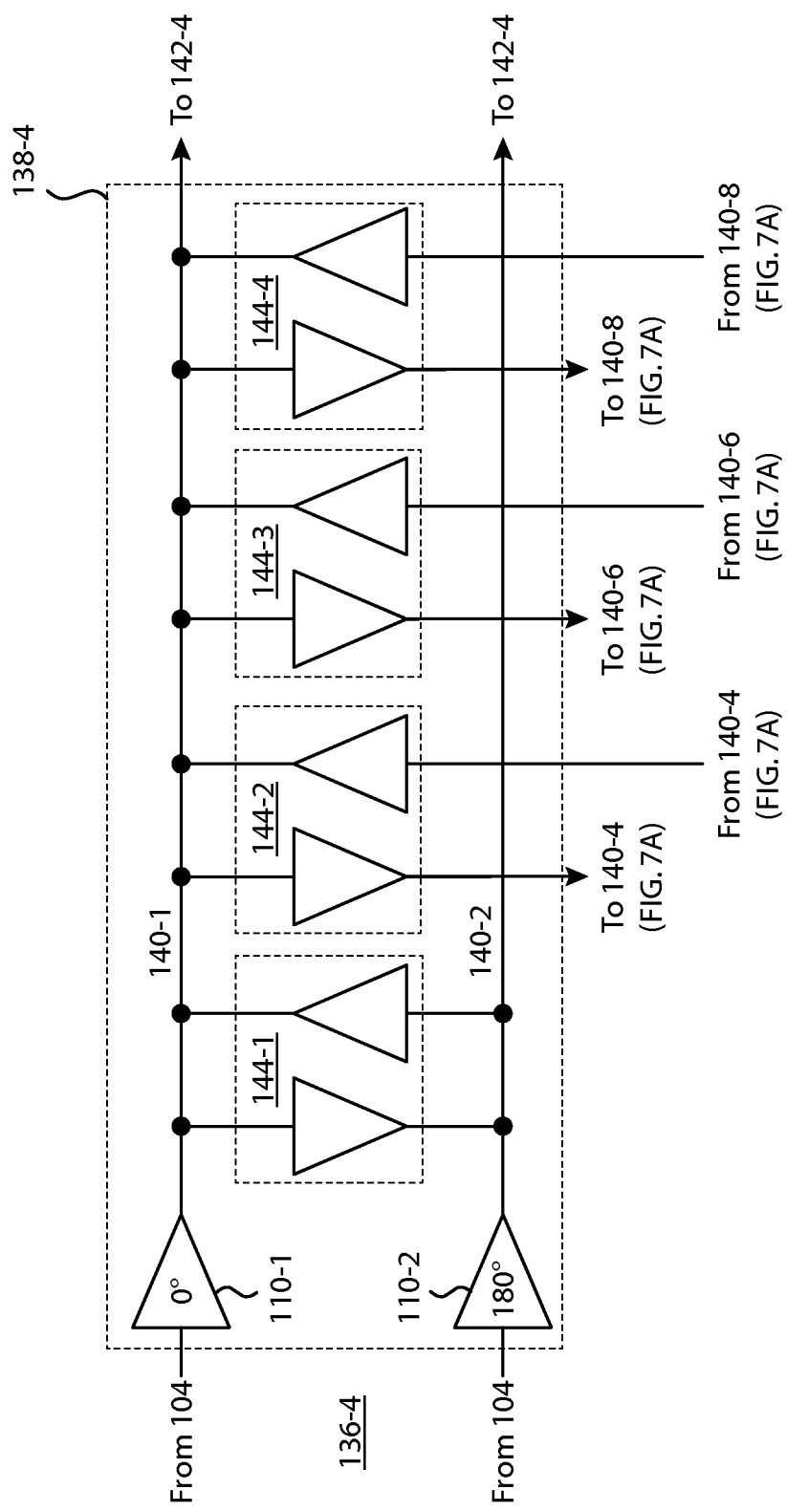
FIG. 7B illustrates an example of a clock distribution circuit of the three-dimensional clock distribution network illustrated in FIG. 7A in accordance with some embodiments.

The differential clock signals in each clock distribution tier 136 is cross-coupled to the differential clock signals in the same clock distribution tier and in the other clock distribution tier. For example, FIG. 7B illustrates one example of distribution circuitry 138-4 formed in tier 106-4. Circuitry 138-4 includes clock processing circuit 110-1, which has its input coupled to conductive line 122-2 (FIG. 7A) such that it receives the zero degree offset clock signal, and clock processing circuit 110-2, which has its input coupled to conductive line 122-1 (FIG. 7A) such that it receives the 180° offset clock signal. The output of clock processing circuit 110-1 is coupled to trace 140-1, which is coupled to lane circuitry 142-4, and the output of clock processing circuit 110-2 is coupled to trace 140-2, which is coupled to lane circuitry 142-4.

A first pair 144-1 of cross-coupled inverters are coupled between trace 140-1 and 140-2 both of which are formed tier 136-4. Cross-coupled inverter pair 144-2 is coupled to trace 140-1 formed in tier 136-4 and to trace 140-4 formed in tier 136-3 as best seen in FIG. 7A. Still referring to FIG. 7A, cross-coupled inverter pair 144-3 is coupled to trace 140-1 of tier 136-3 and to trace 140-6 formed in tier 136-2, and cross-coupled inverter pair 144-4 is coupled to trace 140-1 and to trace 140-8, which is formed in tier 136-1.

Figure 7C:
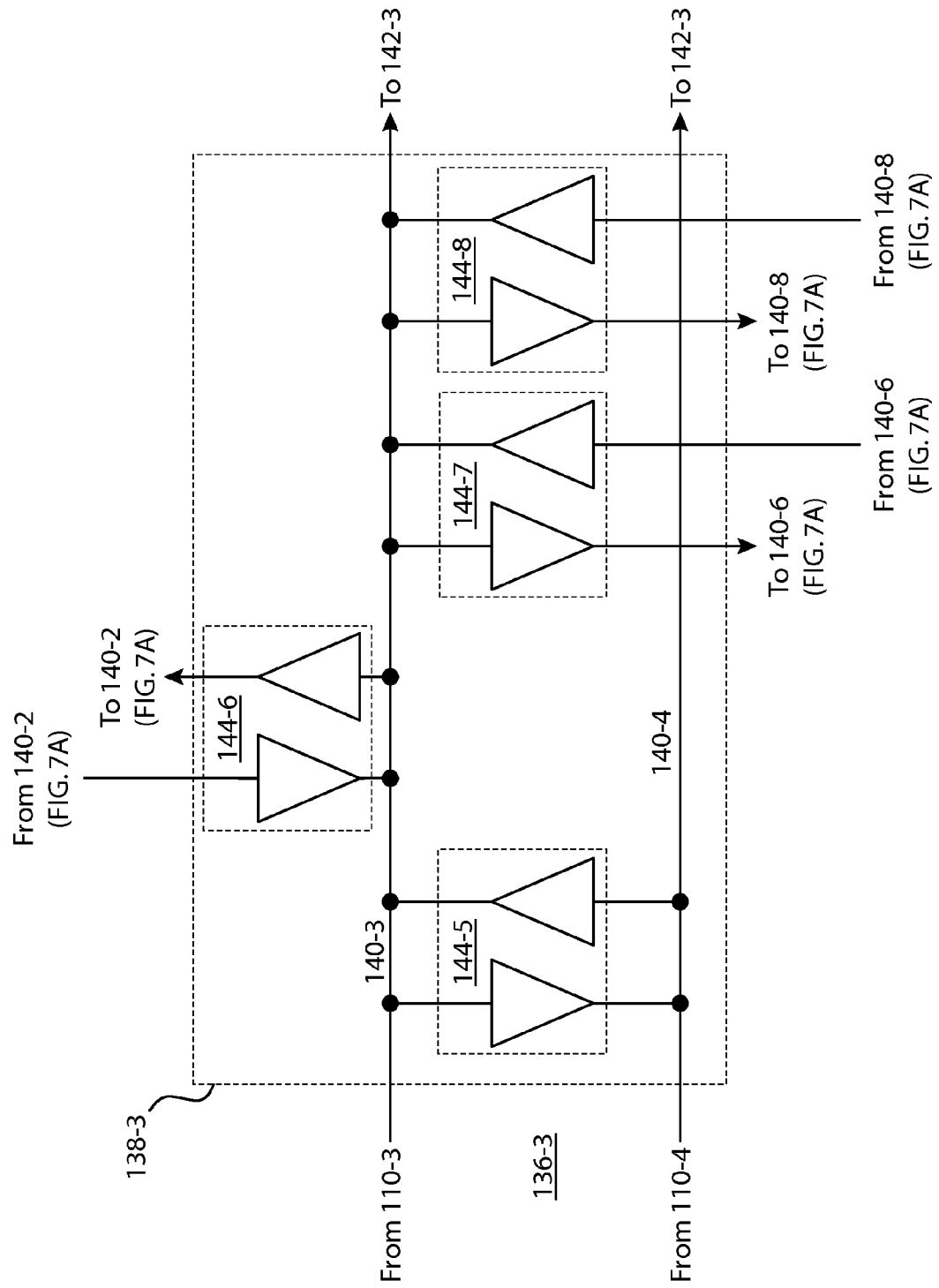
FIG. 7C illustrates an example of another clock distribution circuit of the three-dimensional clock distribution network illustrated in FIG. 7A in accordance with some embodiments.

FIG. 7C illustrates one example of distribution circuitry 138-3, which is formed in tier 136-3. Circuitry 138-3 includes a cross-coupled inverter pair 144-5 coupled between traces 140-3 and 140-4 formed in tier 136-3 and coupled to clock processing circuits 110-2 and 110-3, respectively. Although not shown as part of distribution circuitry 138-3 in FIG. 7C, clock processing circuits 110-2, 110-3 shown in FIG. 7A can be considered as part of distribution circuitry 138-3. Traces 140-3 and 140-4 are coupled to lane circuitry 142-3, which is best seen in FIG. 7A.

Cross-coupled inverter pair 144-6 is coupled to trace 140-3 formed in tier 136-3 and to trace 140-2 formed in tier 136-4 as best seen in FIG. 7A. Still referring to FIG. 7C, cross-coupled inverter pair 144-7 is coupled to trace 140-3 of tier 136-3 and to trace 140-6 formed in tier 136-2, and cross-coupled inverter pair 144-8 is coupled to trace 140-3 and to trace 140-8, which is formed in tier 136-1.

Figure 7D:
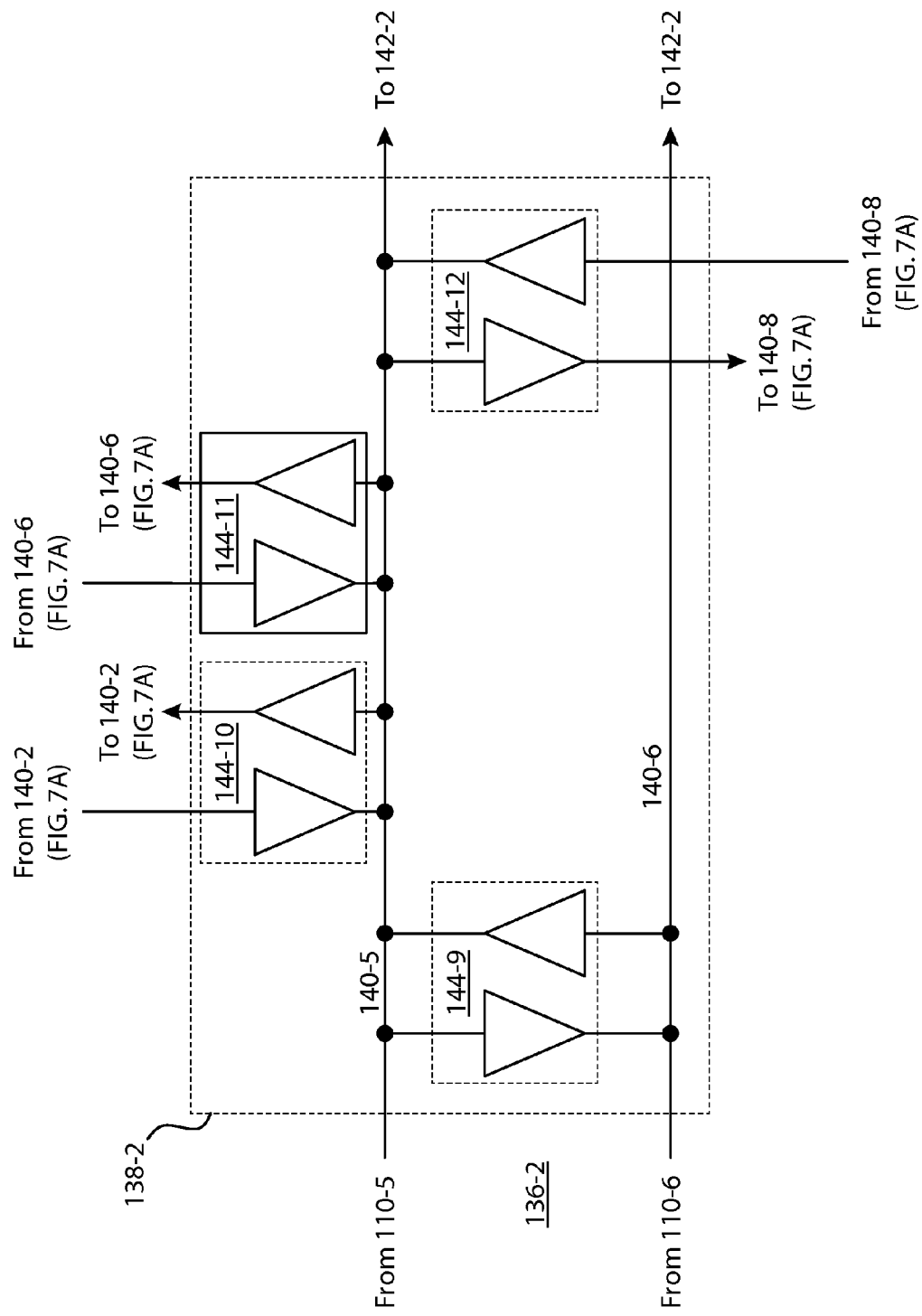
FIG. 7D illustrates an example of another clock distribution circuit of the three-dimensional clock distribution network illustrated in FIG. 7A in accordance with some embodiments.

FIG. 7D illustrates one example of distribution circuitry 138-2, which is formed in tier 136-2. Circuitry 138-2 includes a cross-coupled inverter pair 144-9 coupled between traces 140-5 and 140-6 formed in tier 136-2 and coupled to clock processing circuits 110-5 and 110-6, respectively. Although not shown as part of distribution circuitry 138-2 in FIG. 7D, clock processing circuits 110-5, 110-6 shown in FIG. 7A can be considered as part of distribution circuitry 138-2. Traces 140-5 and 140-6 are coupled to lane circuitry 142-2 as best seen in FIG. 7A.

Cross-coupled inverter pair 144-10 is coupled to trace 140-5 formed in tier 136-2 and to trace 140-2 formed in tier 136-4 as best seen in FIG. 7A. Still referring to FIG. 7D, cross-coupled inverter pair 144-10 is coupled to trace 140-5 of tier 136-2 and to trace 140-6 formed in tier 136-3, and cross-coupled inverter pair 144-12 is coupled to trace 140-5 and to trace 140-8, which is formed in tier 136-1.

Figure 7E:
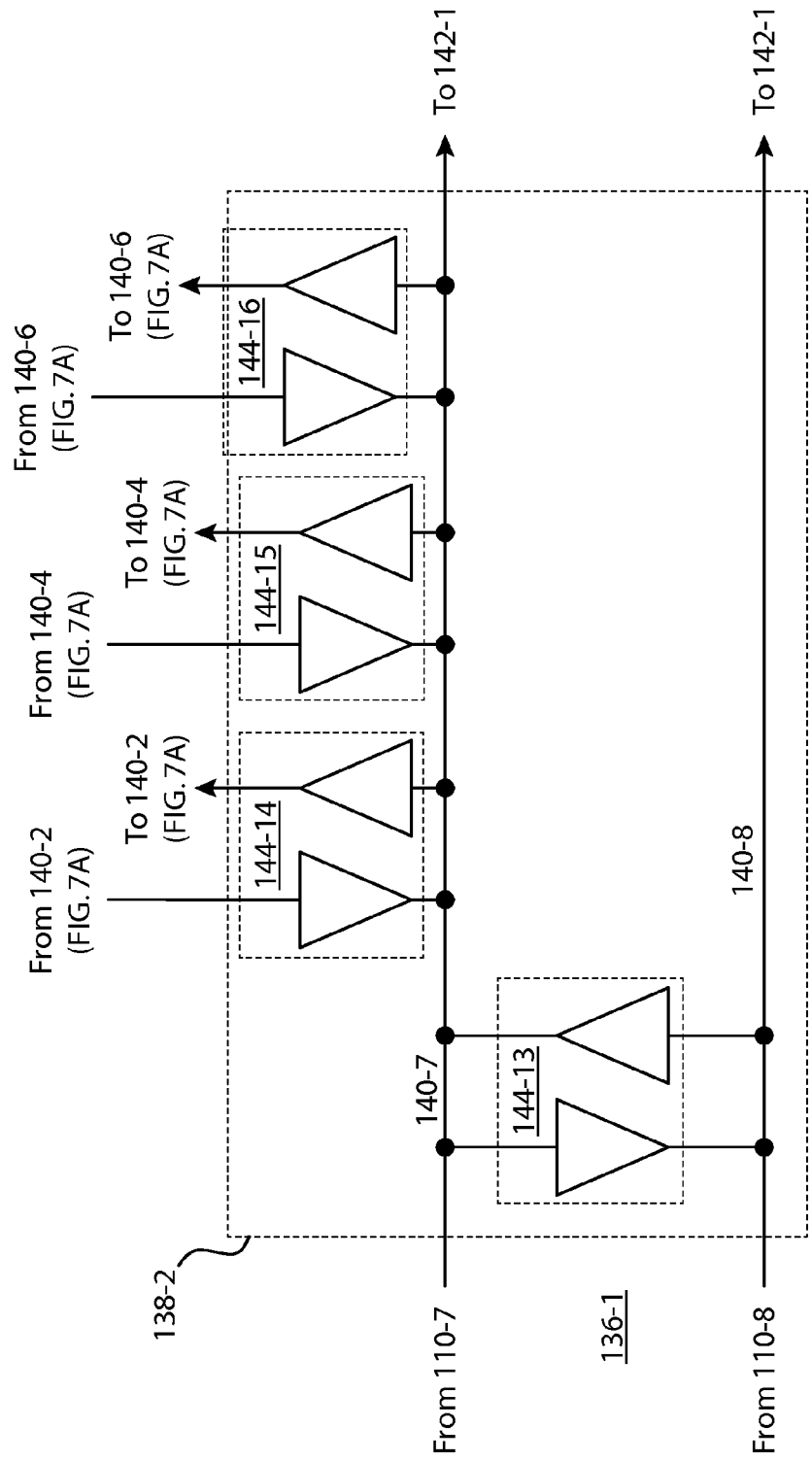
FIG. 7E illustrates an example of another clock distribution circuit of the three-dimensional clock distribution network illustrated in FIG. 7A in accordance with some embodiments.

FIG. 7E illustrates one example of distribution circuitry 138-1, which is formed in tier 136-1. Circuitry 138-1 includes a cross-coupled inverter pair 144-13 coupled between traces 140-7 and 140-8, which are formed in tier 136-1 and are coupled to clock processing circuits 110-7, 110-8, respectively. Although not shown as part of distribution circuitry 138-1 in FIG. 7E, clock processing circuits 110-7, 110-8 shown in FIG. 7A can be considered as part of distribution circuitry 138-1. Traces 140-7 and 140-8 are coupled to lane circuitry 142-1 as best seen in FIG. 7A.

Cross-coupled inverter pair 144-14 is coupled to trace 140-7 formed in tier 136-1 and to trace 140-2 formed in tier 136-4 as best seen in FIG. 7A. Referring again to FIG. 7E, cross-coupled inverter pair 144-15 is coupled to trace 140-7 of tier 136-1 and to trace 140-4 formed in tier 136-3, and cross-coupled inverter pair 144-16 is coupled to trace 140-7 and to trace 140-6, which is formed in tier 136-2. The cross-coupling of differential signal lines disposed in different tiers of 3D CD network 700 prevents the differential signals from intra-tier skew and tier-to-tier skew such that each lane 142-1, 142-2, 142-3, 142-3 receives two signals that are 180° out of phase with each other and are received at each lane approximately simultaneously.

Figure 8:
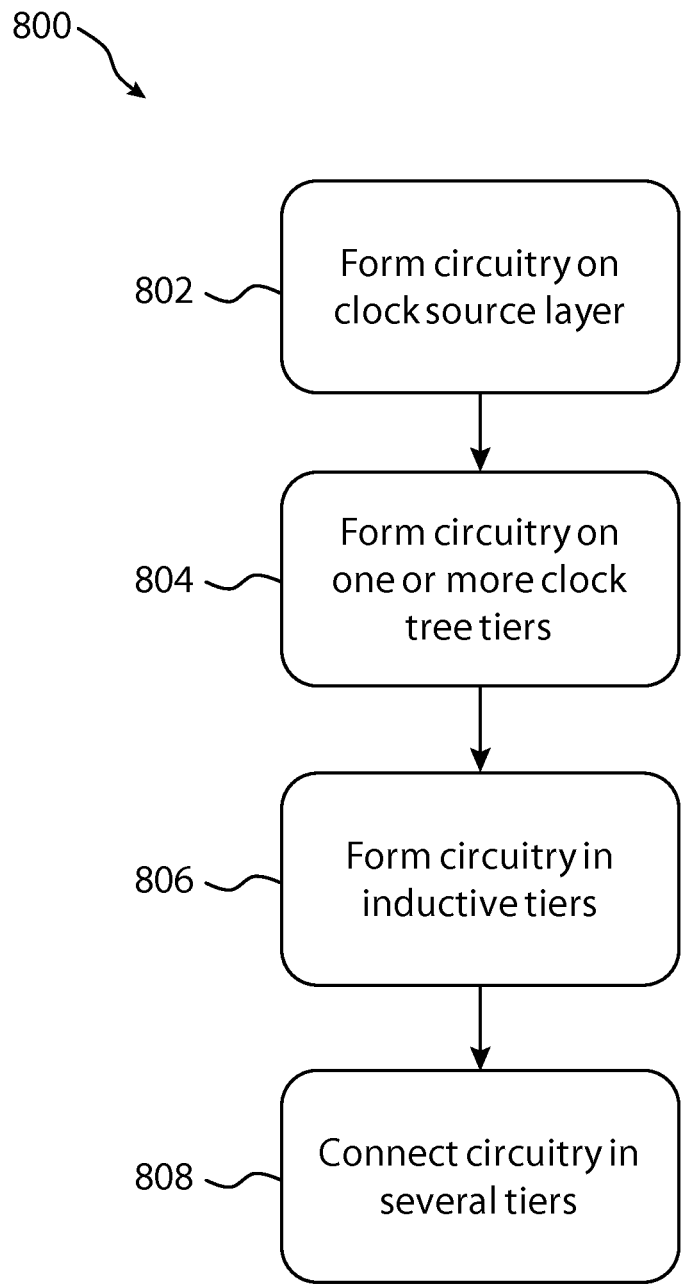
FIG. 8 is a flow diagram of one example of forming a three-dimensional clock distribution network in accordance with some embodiments.

FIG. 8 is a flow diagram of one example of a method 800 manufacturing a three-dimensional semiconductor memory in accordance with some embodiments. At block 802, circuitry is formed in a clock source tier. For example, the active devices of a PLL circuit, differential clock circuit, and/or clock tree circuitry is formed in a first layer that is to be a clock source tier. In some embodiments, the clock circuit and, if applicable, the clock tree circuitry are formed in the clock source tier using complementary metal oxide semiconductor ("CMOS") semiconductor processing technology.

At block 804, one or more clock tiers are formed. For example, the active devices of clock tree circuits, e.g., clock tree circuits 108A, 108B, are formed in one or more tiers. In some embodiments, the clock tree tiers are disposed above and/or below the clock source tier formed at block 802 and are formed using a CMOS semiconductor processing technology suitable for use in creating a 3D IC. The formation of the one or more clock tree tiers includes forming one or more power grid lines in the conductive layers over the active device layer in which the active device are formed in some embodiments.

At optional block 806, one or more inductive tiers are formed. As described above, in some embodiments, an inductive tier is not formed. For example, some applications in which the 3D CD is to be implemented do not require the use of inductors to further limit parasitics, such as applications having slow operating frequencies. The formation of an inductive tier includes forming one or more inductors 130 in the inductive tier such that the inductors are aligned with one or more destination nodes of the clock tree circuits formed in the clock tree tiers.

At block 808, the circuitry in the several tiers are coupled together. In some embodiments, the circuitry in the several tiers are coupled together using one or more conductive lines, such as, for example, ILVs. The use of ILVs reduces the distance between the clock tree circuits in the different layers and reduces skew between different tiers.

The disclosed circuits and methods described herein advantageously reduce the floor plan needed to implement a clock grid. For example, by implementing a plurality of symmetric clock tree tiers, the planar area required to implement the clock grid can be reduced because the 3D CD increases vertically (i.e., in the z-direction) as opposed to horizontally (i.e. in the x- and y-directions). Further, the 3D CDs disclosed herein provide for shorter traces throughout a clock grid, which reduces the parasitic load on the grid and increases the operating speed of the resultant grid. Additionally, the inclusion of a separate inductive tier does not impact the power grid of the clock tree circuits such that the routing resource overhead is not impacted. The disclosed system and methods also enable skew between different tiers, within a same tier (i.e., intra-tier), and between different lanes to be reduced.

In some embodiments, an integrated circuit includes a clock source tier and at least two clock tree tiers disposed in a vertical stack with the clock source tier. The clock source tier includes a clock circuit, and each of the at least two clock tree tiers includes a clock tree circuit. The clock circuit is disposed in the clock source tier is coupled to the clock tree circuits disposed in the at least two clock tree tiers by at least one inter-layer via.

In some embodiments, each clock tree tier includes a respective power grid.

In some embodiments, the integrated circuit includes an inductive tier having at least one inductor and disposed in the vertical stack with the clock source tier and the at least two clock tree tiers.

In some embodiments, at least a portion of the inductor is disposed above a clock destination node of the at least two clock tree tiers.

In some embodiments, at least one clock tree tier includes at least two clock tree circuits.

In some embodiments, the clock source tier is disposed between the at least two clock tree tiers.

In some embodiments, a first destination node in a first clock tree tier of the at least two clock tree tiers is coupled to a second destination node in a second clock tree tier of the at least two clock tree tiers by an inter-layer via.

In some embodiments, at least one of the at least two clock tree tiers includes at least two destination nodes that are coupled together.

In some embodiments, an integrated circuit includes a clock source tier and at least two clock distribution tiers disposed in a vertical stack with the clock source tier. The clock source tier includes a clock circuit, and each of the at least two clock tree tiers includes a clock distribution circuit. The clock circuit is disposed in the clock source tier is coupled to the clock distribution circuits disposed in the at least two clock distribution tiers by at least one inter-layer via.

In some embodiments, the clock circuit includes at least two outputs for outputting differential clock signals.

In some embodiments, the clock distribution circuits include a plurality of cross-coupled inverter pairs.

In some embodiments, each clock distribution tier includes at least two traces with each trace coupled to a respective output of the clock circuit of the clock source tier.

In some embodiments, the clock distribution circuit in a first clock distribution tier includes a pair of cross-coupled inverters coupled to a trace disposed in the first clock distribution tier and to a trace disposed in a second clock distribution tier.

In some embodiments, an integrated circuit includes a clock source tier, a plurality of clock tree tiers, and an inductive tier disposed in a vertical stack with the clock source tier and the plurality of clock tree tiers. The clock source tier includes a clock circuit, each of the plurality of clock tree tiers includes at least one clock tree circuit, and the inductive tier the inductive tier includes at least one inductor. The clock circuit disposed in the clock source tier is coupled to the clock tree circuits disposed in the plurality of clock tree tiers by at least one inter-layer via.

In some embodiments, each clock tree tier includes a respective power grid.

In some embodiments, at least a portion of the inductor is disposed above a clock destination node of the plurality of clock tree tiers.

In some embodiments, at least one clock tree tier includes at least two clock tree circuits.

In some embodiments, the clock source tier is disposed between two clock tree tiers of the plurality of clock tree tiers.

In some embodiments, a first destination node in a first clock tree tier of the plurality of clock tree tiers is coupled to a second destination node in a second clock tree tier of the plurality of clock tree tiers by an inter-layer via.

In some embodiments, at least one of the plurality of clock tree tiers includes at least two destination nodes that are coupled together.

Although the disclosed circuits and methods have been described in terms of exemplary embodiments, they are not limited thereto. Rather, the appended claims should be construed broadly, to include other variants and embodiments of the circuits and methods, which may be made by those skilled in the art without departing from the scope and range of equivalents of the circuits and methods.

What is claimed is:

1. An integrated circuit, comprising:
a clock source tier including a clock circuit; and
at least two clock distribution tiers disposed in a vertical stack with the clock source tier, each of the at least two clock distribution tiers including a clock distribution circuit,
wherein each clock distribution circuit includes at least one pair of cross-coupled inverters,
wherein a first clock distribution tier of the at least two clock distribution tiers includes a first pair of traces to which a first pair of cross-coupled inverters is coupled, and a second pair of cross-coupled inverters coupled to one of the first pair of traces and one of a second pair of traces, wherein the second pair of traces is disposed in a second clock distribution tier of the at least two clock distribution tiers.

2. The integrated circuit of claim 1, wherein the first clock distribution tier includes a third pair of cross-coupled inverters, the third pair of cross-coupled inverters coupled to one of the first pair of traces of the first clock distribution tier.

3. The integrated circuit of claim 1, wherein the second clock distribution tier includes a first pair of cross-coupled inverters that is coupled to the second pair of traces.

4. The integrated circuit of claim 3, wherein the second clock distribution tier includes a second pair of cross-coupled inverters, the second pair of cross-coupled inverters coupled to one trace of the first pair of traces of the second clock distribution tier and to one of the first pair of traces of the first clock distribution tier.

5. The integrated circuit of claim 4, wherein the second clock distribution tier includes a third pair of cross-coupled inverters, the third pair of cross-coupled inverters coupled to one trace of the first pair of traces of the second clock distribution tier and to a trace in the third clock distribution tier.

6. An integrated circuit, comprising:
a clock source tier;
a first clock distribution tier arranged in a vertical stack with the clock source tier, the first clock distribution tier including:
a first inverter having an input coupled to a first trace of the first clock distribution tier and an output coupled to a second trace of the first clock distribution tier, and
a second inverter having an input coupled to the second trace of the first clock distribution tier and an output coupled to the first trace of the first clock distribution tier; and
a second clock distribution tier arranged in the vertical stack with the clock source tier and the first clock distribution tier, the second clock distribution tier including:

a third inverter having an input coupled to a first trace of the second clock distribution tier and an output coupled to a second trace of the second clock distribution tier, and a fourth inverter having an input coupled to the second trace of the second clock distribution tier and an output coupled to the first trace of the second clock distribution tier, wherein the clock source tier includes a clock circuit that is coupled to each of the first and second clock distribution tiers by at least one via, wherein the first clock distribution tier includes a fifth inverter having an input coupled to the first trace of the first clock distribution tier and an output coupled to the second trace of the second clock distribution tier, and a sixth inverter having an input coupled to the second trace of the second clock distribution tier and an output coupled to the first trace of the first clock distribution tier.

7. The integrated circuit of claim 6, wherein the second clock distribution tier includes a seventh inverter having an input coupled to the first trace of the second clock distribution tier and an output coupled to the second trace of the first clock distribution tier, and an eighth inverter having an input coupled to the second trace of the first clock distribution tier and an output coupled to the first trace of the second clock distribution tier.

8. The integrated circuit of claim 7, further comprising a third clock distribution tier including a ninth inverter having an input coupled to a first trace of the third clock distribution tier and an output coupled to a second trace of the third clock distribution tier, and a tenth inverter having an input coupled to the second trace of the third clock distribution tier and an output coupled to the first trace of the third clock distribution tier.

9. The integrated circuit of claim 7, further comprising a third clock distribution tier including a ninth inverter having an input coupled to a first trace of the third clock distribution tier and an output coupled to the second trace of the first clock distribution tier, and a tenth inverter having an input coupled to the second trace of the first clock distribution tier and an output coupled to the first trace in the third inductive tier.

10. The integrated circuit of claim 7, further comprising a third clock distribution tier including a ninth inverter having an input coupled to a first trace of the third clock distribution tier and an output coupled to the second trace of the second clock distribution tier, and a tenth inverter having an input coupled to the second trace of the second clock distribution tier and an output coupled to the first trace of the third clock distribution tier.

11. An integrated circuit, comprising:

a clock source tier;

a first clock distribution tier arranged in a vertical stack with the clock source tier; and a second clock distribution tier arranged in a vertical stack with the clock source tier and the first clock distribution tier, wherein the first clock distribution tier includes a first inverter having an input coupled to a first trace of the first clock distribution tier and an output coupled to a second trace of the second clock distribution tier, and a second inverter having an input coupled the second trace of the second clock distribution tier and an output coupled to the first trace of the first clock distribution tier, wherein the second clock distribution tier includes a third inverter having an input coupled to the first trace of the second clock distribution tier and an output coupled to the second trace of the first clock distribution tier, and a fourth inverter having an input coupled to the second trace of the first clock distribution tier and an output coupled to the first trace of the second clock distribution tier, and wherein the clock source tier includes a clock circuit that is coupled to each of the first and second clock distribution tiers by at least one via.

12. The integrated circuit of claim 11, further comprising a third clock distribution tier including a fifth inverter having an input coupled to a first trace of the third clock distribution tier and an output coupled to the second trace of the first clock distribution tier, and a sixth inverter having an input coupled the second trace of the first clock distribution tier and an output coupled to the first trace of the third clock distribution tier.

13. The integrated circuit of claim 12, wherein the third clock distribution tier includes a seventh inverter having an input coupled to the first trace of the third clock distribution tier and an output coupled to the second trace of the second clock distribution tier, and an eighth inverter having an input coupled to the second trace of the second clock distribution tier and an output coupled to the first trace of the third clock distribution tier.

14. The integrated circuit of claim 13, wherein the third clock distribution tier includes a ninth inverter having an input coupled to the first trace of the third clock distribution tier and an output coupled to a second trace of the third clock distribution tier, and a tenth inverter having an input coupled to the second trace of the third clock distribution tier and an output coupled to the first trace of the third clock distribution tier.

15. The integrated circuit of claim 11, wherein the first clock distribution tier includes a fifth inverter having an input coupled to the first trace of the first clock distribution tier and an output coupled to the second trace of the first clock distribution tier, and a sixth inverter having an input coupled to the second trace of the first clock distribution tier and an output coupled to the first trace of the first clock distribution tier.

16. The integrated circuit of claim 11, wherein the second clock distribution tier includes a fifth inverter having an input coupled to the first trace of the second clock distribution tier and an output coupled to the second trace of the second clock distribution tier, and a sixth inverter having an input coupled to the second trace of the second clock distribution tier and an output coupled to the first trace of the second clock distribution tier.

* * * * *